US00RE42387E

(19) United States
(12) Reissued Patent
Morche

(10) Patent Number: US RE42,387 E
(45) Date of Reissued Patent: May 24, 2011

(54) METHOD FOR COMPENSATING NON-LINEARITY OF A SIGMA-DELTA ANALOG-TO-DIGITAL CONVERTER

(75) Inventor: Dominique Morche, Meylan (FR)

(73) Assignee: Fahrenheit Thermoscope LLC, Las Vegas, NV (US)

(21) Appl. No.: 11/487,666

(22) PCT Filed: Jun. 23, 2000

(86) PCT No.: PCT/FR00/01754

§ 371 (c)(1),
(2), (4) Date: Jun. 5, 2002

(87) PCT Pub. No.: WO01/01578

PCT Pub. Date: Jan. 4, 2001

Related U.S. Patent Documents

Reissue of:
(64) Patent No.: 6,653,958
Issued: Nov. 25, 2003
Appl. No.: 10/019,170
Filed: Jun. 5, 2002

U.S. Applications:
(63) Continuation of application No. 11/287,568, filed on Nov. 23, 2005, now abandoned.

(30) Foreign Application Priority Data

Jun. 29, 1999 (FR) ..... 99 08323

(51) Int. Cl.
*H03M 3/06* (2006.01)
*H03M 1/10* (2006.01)
*H03M 3/00* (2006.01)

(52) U.S. Cl. ..... 341/118; 341/120; 341/143

(58) Field of Classification Search ..... 341/117–120, 341/143, 155; 73/1.01; 375/252; 708/319; 382/196, 201, 246; 704/200, 230, 265
See application file for complete search history.

(56) References Cited

U.S. PATENT DOCUMENTS

| | | | |
|---|---|---|---|
| 4,772,871 | A | 9/1988 | Suzuki et al. |
| 5,134,402 | A | 7/1992 | Miyoshi |
| 5,257,026 | A | 10/1993 | Thompson et al. |
| 5,781,137 | A | 7/1998 | Knudsen |
| 5,982,316 | A | 11/1999 | Shin |

FOREIGN PATENT DOCUMENTS

FR 0001754 6/2000

OTHER PUBLICATIONS

Sarhang-Nejad and Temes: A High-Resolution Multibit ADC with Digital Correction and Relaxed Amplifier Requirements IEEE Journal of Solid-Stat Circuits, vol. 28, No. 6, Jun. 1993, pp. 648-660.
Search report for PCT/FR 00/01754; Entitled: Method for Compensating Non-Linearity of a Sigma-Delta Analog-To-Digital Converter.

*Primary Examiner* — Jean B Jeanglaude

(57) ABSTRACT

The invention concerns a method for compensating the non-linearity of a sigma-delta analog-to-digital converter (A2) with quantization at N levels comprising a digital-to-analog converter (24). The method comprises a calibrating step which consists in transforming the multibit sigma-delta analog-to-digital converter (A2) into a sigma-delta analog-to-digital converter with quantization at three levels, then at two levels. The correction values of each level to be corrected are accurately measured. The method also comprises a normal functioning phase which consists, when the sigma-delta an analog-to-digital converter (A2) is operating with quantization at N levels, in producing an instantaneous correction of errors of the analog-to-digital converter (24) using said correction values.

35 Claims, 3 Drawing Sheets

METHOD FOR COMPENSATING NON-LINEARITY OF A SIGMA-DELTA ANALOG-TO-DIGITAL CONVERTER

Matter enclosed in heavy brackets [ ] appears in the original patent but forms no part of this reissue specification; matter printed in italics indicates the additions made by reissue.

*More than one reissue application has been filed for the reissue of U.S. Pat. No. 6,653,958. The present application, U.S. patent application Ser. No. 11/487,666, is a continuation of U.S. patent application Ser. No. 11/287,568, filed Nov. 23, 2005, now abandoned.*

BACKGROUND OF THE INVENTION

1. Field of the Invention

The present invention concerns a method and a system for compensating the non-linearity of a sigma-delta analog-to-digital converter.

2. Description of the Related Art

Equipment in all fields, electronic or otherwise, consumer or professional, increasingly employs digital rather than analog processing. This choice is often justified by technical advantages that are now well known, such as very stable parameters, excellent reproducibility of results, and increased functionality.

The external world being inherently analog, in most cases analog-to-digital converters (ADC) and digital-to-analog converters (DAC) provide at some level the interface between the external world and the digital core of the equipment.

The development of powerful digital processors has created a need for a high-resolution analog-to-digital converter compatible with CMOS VLSI (Very Large Scale Integration) technologies. The sigma-delta modulation converter in particular has exploited technological developments.

As shown in FIG. 1, a sigma-delta analog-to-digital converter primarily includes an adder 1, a noise-shaping filter 4, a quantizer 5, a digital filter 6 and a feedback loop 8 connecting the output of the quantizer 5 to the negative input 3 of the adder 1. The feedback loop 8 includes an analog-to-digital converter 7. A sample-and-hold device (not shown), usually on the input side of the adder 1, oversamples the signal at a given frequency and then maintains the level at the output 2 constant to enable the sigma-delta analog-to-digital converter to process the data. The noise-shaping filter 4 shapes the noise spectrum to attenuate the noise power in the frequency range of the wanted signal. The quantizer 5 employs a set of discrete levels and associates the closest discrete level with the analog value at its input. This introduces an error known as "quantizing noise". The performance of a converter is conditioned by the quantizing noise power. To this end, the oversampling performed in the sample-and-hold device (not shown) and the feedback loop 8 "pushes" the maximum quantizing noise power out of the pass-band of the signal (the band of frequencies at which the system operates). The digital filter 6 at the output of the sigma-delta analog-to-digital converter, also known as a decimation filter, eliminates the shaped quantizing noise and undersamples the output signal. The digital-to-analog converter 7 has a transfer function that links the input (quantizing) digital levels delivered by the quantizer 5 to output analog values that are then fed to the negative input 3 of the adder 1. The analog-to-digital converter 7 associates a corresponding analog output value with each quantizing input level.

The fundamental principle of the sigma-delta analog-to-digital converter consists firstly of oversampling the signal using the analog sample-and-hold device, pushing the quantizing noise power maximum outside the pass-band of the signal, by integrating the quantizer into a feedback loop, and then filtering the signal obtained by means of a digital filter 6. These conjugate actions initially "dilute" the quantizing noise in a wide band thanks to the oversampling, shape the noise spectrum, and then filter the quantizing noise to retain only the wanted band of the signal.

Using a multibit quantizer associated with a multibit digital-to-analog converter in the feedback loop of a sigma-delta analog-to-digital converter is beneficial because it improves the signal/noise ratio and dynamic range of the sigma-delta analog-to-digital converter.

However, the performance of the sigma-delta analog-to-digital converter is highly dependent on the linearity of the sigma-delta analog-to-digital converter 7 used in the feedback loop 8.

One prior art solution that has been proposed for calibrating the multibit digital-to-analog converter regardless of the number of levels is described by SARHANG-NEJAD and G. C. TEMES, "A High Resolution Multibit Sigma Delta ADC with Digital Correction and Relaxed Amplifier Requirements", IEEE Journal of solid state circuits, vol. 28, N 6, June 1993, pages 648-660. It proposes to improve the performance of the sigma-delta analog-to-digital converter by measuring the non-linearities of the digital-to-analog converter 7 during a calibration phase. During the calibration phase, the multibit sigma-delta analog-to-digital converter is converted into a one-bit sigma-delta analog-to-digital converter (only the most significant bit at the output of the quantizer is considered). The calibration phase essentially employs the components shown in FIG. 2, which shows the adder 1, the noise-shaping filter 4, the quantizer 5 and the decimation filter 6. The digital-to-analog converter 7 is replaced by switching means Ea for imposing at the negative input 3 of the adder 1 either a positive voltage Vref or a negative voltage −Vref, depending on the value of the output of the one-bit quantizer 5. The digital-to-analog converter 7 is then placed at the positive input 2 of the adder 1. A counter Eb controls the digital-to-analog converter 7 by feeding it a digital signal (corresponding to one of the levels available to the quantizer 5) so that it generates an analog signal at the input of the one-bit sigma-delta analog-to-digital converter. An adder Ec receiving the output signal of the counter Eb and the output signal of the decimation filter 6 calculates a correction value that is stored in a memory module Ed. The counter Eb also controls addressing of the memory module Ed.

Each correction value represents a digital error caused by the digital-to-analog converter 7 in converting between a digital value and its analog conversion. During the phase of normal use, the sigma-delta analog-to-digital converter is equivalent to that shown in FIG. 1 with a digital correction module (not shown) containing the correction values added in front of the decimation filter 6. All digital values leaving the quantizer 5 are corrected by the digital correction module before reaching the decimation filter 6. Thus the corrected digital value entering the decimation filter 6 is substantially equal to the analog value at the negative input 3 of the adder 1.

The above technique has a number of drawbacks, associated with the manner in which the correction values are measured. In the calibration phase (FIG. 2), the output of the digital-to-analog converter 7 is fed to the positive input 2 of the adder 1, whereas under normal operating conditions (FIG. 1 plus correction module) the digital-to-analog converter 7 is in the feedback loop 8 and its output is fed to the negative input 3 of the adder 1. The behavior of the digital-to-analog converter 7 differs between the calibration phase and normal operating conditions because the two inputs of the adder 1 are different. The two inputs of the adder 1 do not have exactly the same capacitance, because it generally uses switched capacitors.

FIG. 3 shows an adder using switched capacitors. The switches 9, 10 and 12, 13 respectively switch a capacitor $C_1$ and a capacitor $C_2$ which are connected to a ground 14. The adder has two inputs E1 and E2 respectively connected to the capacitors $C_1$ and $C_2$. An operational amplifier 11 performs the addition operation by means of a feedback capacitor C. The capacitors $C_1$ and $C_2$ theoretically have the same capacitance. However, in practice, because of manufacturing tolerances, their capacitances are different and the gain between the two inputs is therefore different.

During the calibration phase, the digital-to-analog converter is therefore connected to the input E1 and the values injected are measured accurately. During the normal operation phase, the digital-to-analog converter included in the feedback loop is connected to the input E2 of the adder. Because the capacitors C1 and C2 are in practice different, the values measured during the calibration phase are therefore not in fact the values injected during the normal operation phase. Also, the accuracy of the measurement may be influenced by offset voltages inherent to the sigma-delta analog-to-digital converter. The offset voltages may not be a problem during the normal operation phase, but can become a problem during the calibration phase because it entails measuring DC voltages.

SUMMARY OF THE INVENTION

The invention aims to solve the above problem by retaining the structure of the sigma-delta analog-to-digital converter during the calibration phase and using only digital signals.

The invention proposes a method of compensating the non-linearity of a sigma-delta analog-to-digital converter with N quantizing levels and including a digital-to-analog converter in a feedback loop. N is an integer greater than two. The method includes a normal operation phase in which a plurality of digital values corresponding to a plurality of quantizing levels are modified by correction values Ci, where i is a positive integer from 1 to N−*2*, calculated during a calibration phase. According to a general feature of the invention, the correction values Ci are calculated from values of the output *of the quantizer* of the sigma-delta analog-to-digital converter processed digitally with the digital-to-analog converter retained in the feedback loop of the sigma-delta analog-to-digital converter and after converting the [multibit] sigma-delta analog-to-digital converter into a sigma-delta analog-to-digital converter with three quantizing levels, for example modifiable levels. The number N is a positive integer greater than 2.

The correction values $C_i$ are used to correct errors caused by the digital-to-analog converter. The corrections are preferably made instantaneously during the normal operation phase.

The method in accordance with the invention of compensating non-linearity includes a calibration phase during which the multibit sigma-delta analog-to-digital converter is converted into a sigma-delta analog-to-digital converter with three quantizing levels $X_m$, $X_M$ and $X_i$, where i is from 1 to N−2; during a period $P1_i$, a predetermined value is delivered to the input of the sigma-delta analog-to-digital converter and the values from the output of the sigma-delta analog-to-digital converter are processed digitally; this calibration phase is executed N−2 times, retaining the levels $X_m$ and $X_M$, and taking successively for the level $X_i$ the N−2 levels other than the levels $X_m$ and $X_M$. The correction values Ci of the N−2 levels other than $X_m$ and $X_M$ are advantageously calculated using the processed values, the N−2 correction values $C_i$ being adapted to modify the N−2 levels other than $X_m$ and $X_M$ during the normal operation phase.

The levels $X_m$, $X_M$ and $X_i$ are digital values that are converted into analog values in accordance with a transfer function of the digital-to-analog converter.

The method can further include, during the calibration phase and before calculating the correction values Ci, at least one step F during which the multibit sigma-delta analog-to-digital converter is converted into a sigma-delta analog-to-digital converter with two quantizing levels $X_m$ and $X_M$. During a period P2, said predetermined value is delivered to the input of the sigma-delta analog-to-digital converter, and the successive values of the output of the sigma-delta analog-to-digital converter are processed digitally. In other words, step F advantageously eliminates any offset voltages in the sigma-delta analog-to-digital converter.

For example, if step F is performed only once, the periods $P1_i$ can all be equal to one another and equal to the period P2.

The calibration phase presupposes that $X_i$ is different from $X_m$ and $X_M$.

In accordance with the invention the sigma-delta analog-to-digital converter with N quantizing levels is converted into a sigma-delta analog-to-digital converter with a number of quantizing levels less than N by modifying quantizing threshold values and by digital processing using internal comparators. In the general case the sigma-delta analog-to-digital converter with N quantizing levels is converted into a sigma-delta analog-to-digital converter with three quantizing levels, and if the optional step F (offset voltage correction) is implemented, it is also converted into a sigma-delta analog-to-digital converter with two quantizing levels.

According to one advantageous feature of the invention, the levels $X_m$ and $X_M$ are respectively the minimum value and the maximum value of the N quantizing levels.

In one embodiment of the invention, during the normal operation phase, its correction value $C_i$ is added to each level $X_i$ present at the output of the quantizer. Thus the digital value after correction is substantially equal to the analog value at the output of the digital-to-analog converter.

In one advantageous variant of the invention, said predetermined value is equal to zero and, during the calibration phase, and during the period $P1_i$ for each level $X_i$, the number $N_i$ of values equal to $X_i$ and the total number $NT_i$ of all the output values are counted at the output of the sigma-delta analog-to-digital converter and a sum $S1_i$ of the $NT_i$ values is calculated. The periods $P1_i$, which are not all equal a priori, can depend on each intermediate level $X_i$. In this case, step F of the calibration phase is executed N−2 times, each time taking a period $P2_i$ equal to each period $P1_i$, and a sum $S2_i$ is calculated of all the values leaving the sigma-delta analog-to-digital converter during each execution, after which a cor rection value $C_i$ corresponding to the value $X_i$ is calculated from the equation (for i from 1 to N−2):

$$C_i = \frac{S2_i - S1_i}{N_i}$$

The period $P1_i$ for each level $X_i$ is preferably equal to the period needed to count the number $N_i$ of values equal to $X_i$ at the output of the sigma-delta analog-to-digital converter (A2) until the number $N_i$ is equal to a given number $N_0$.

If step F is executed only once (in which case all the periods $P1_i$ are equal to each other and to P2), there is only one sum S2 and Ci can be calculated from the following equation (for i from 1 to N−2):

$$C_i = \frac{S2_i - S1_i}{N_i}$$

There are various ways to calculate the correction values Ci.

The invention also proposes a system for compensating the non-linearity of a sigma-delta analog-to-digital converter with N quantizing levels including a digital-to-analog converter and a digital filter. According to a general feature of the invention, the system includes means for implementing the various phases previously described.

In a preferred embodiment, the calculating and modifying means include:

- counter means for counting the values leaving the sigma-delta analog-to-digital converter,
- at least one accumulator for summing the values leaving the sigma-delta analog-to-digital converter,
- storage means for memorizing numbers delivered by the counting means and the accumulator,
- processor means for performing calculations on the memorized numbers and generating control signals in the system for controlling the various phases,
- a correction module between the quantizer and the digital filter and communicating with the processor means, and
- comparators and a digital processor module internal to the N-level quantizer and capable of converting the quantizer into a quantizer with fewer than N quantizing levels.

BRIEF DESCRIPTION OF THE DRAWINGS

Other advantages and features of the invention will become apparent on examining the detailed description of one non-limiting embodiment and the accompanying drawings in which.

Although the invention is not limited to it, one example of the method and the system according to the invention for compensating the non-linearity of a sigma-delta analog-to-digital converter with three quantizing levels will now be described.

DETAILED DESCRIPTION OF PREFERRED EMBODIMENTS

Figure 1:
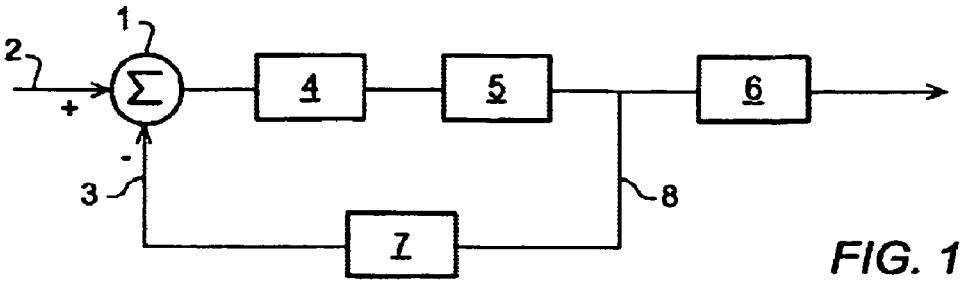
FIG. 1 (PRIOR ART)
FIG. 1 depicts a prior art sigma-delta analog-to-digital converter.
Figure 2:
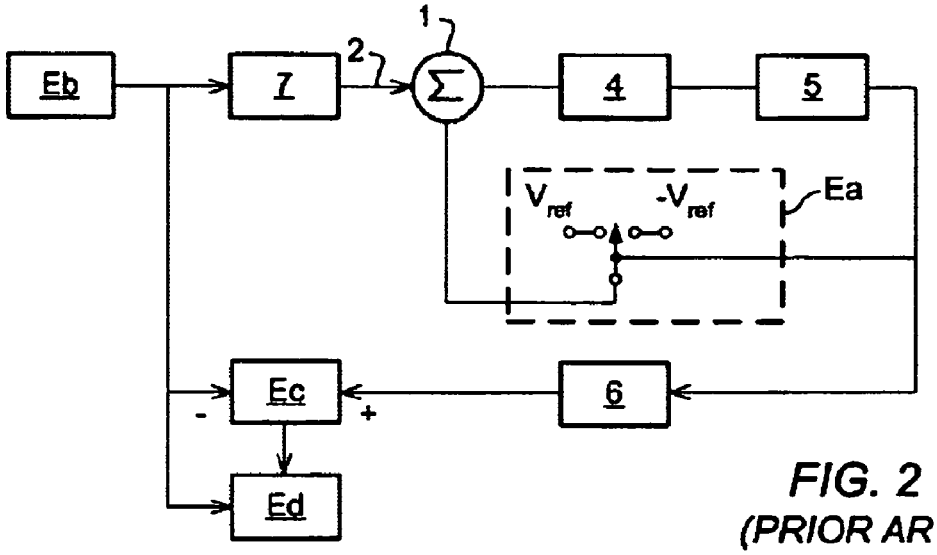
FIG. 2 (PRIOR ART)
FIG. 2 is a prior art depiction of components employed in a calibration phase of a sigma-delta analog-to-digital converter.
Figure 3:
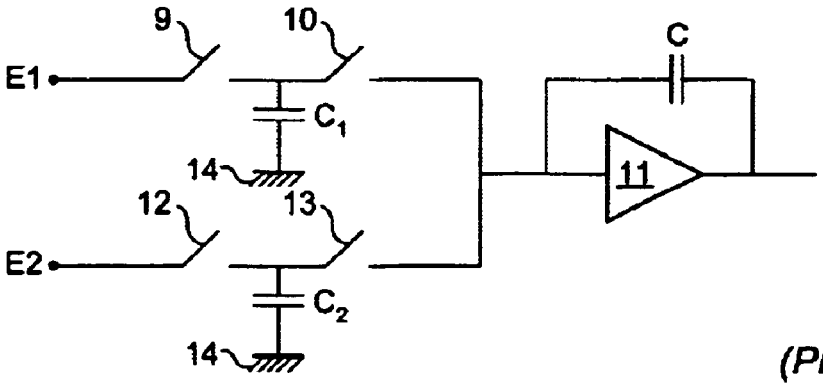
FIG. 3 (PRIOR ART)
FIG. 3 depicts a prior art adder using switched capacitors.
Figure 4:
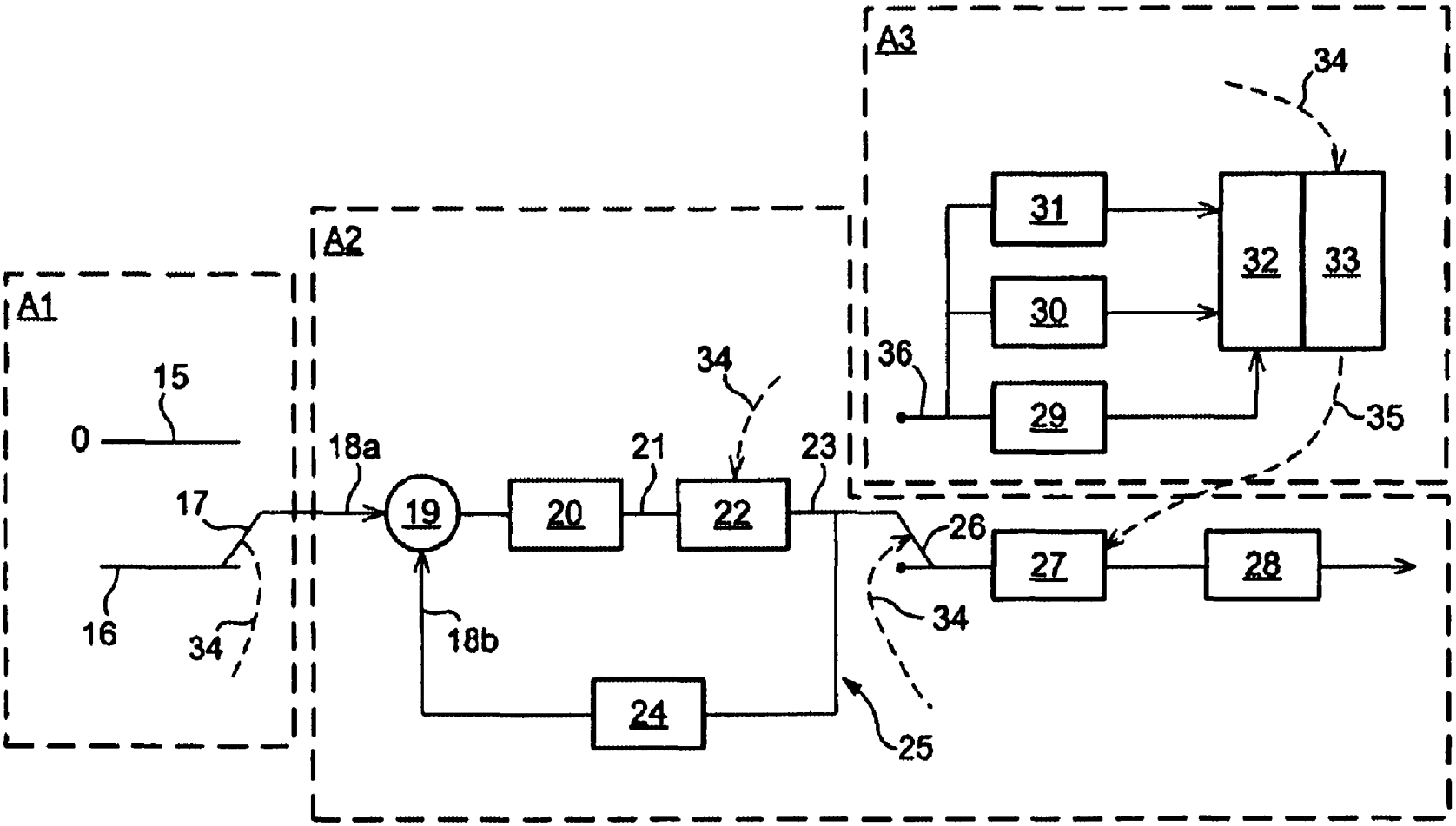
FIG. 4 depicts a diagram of the general structure of a sigma-delta analog-to-digital converter implementing the invention.

The FIG. 4 diagram is in three parts. A first part A1 relates to the input signals, a second part A2 relates to the sigma-delta analog-to-digital converter itself, and a third part A3 relates to a control system.

The first part A1 has a zero value input 15 used during a calibration phase and an input 16 receiving the analog signal to be digitized by the sigma-delta analog-to-digital converter. A switch 17 connects either to the input 15 or to the input 16.

In the second part A2, a signal from the input 15 or 16 reaches the positive input 18a of an adder 19. A noise-shaping filter 20 recovers the output signal of the adder 19. The signal 21 leaving the noise-shaping filter 20 is fed to the input of a quantizer 22 with three quantizing levels: −1, 0 and 1. The quantizer 22 generates a digital signal 23 which, during a normal operation phase, is fed to the input of a corrector module 27 via a switch 26. The output signal of the corrector module 27 is then passed through a digital filter 28 in order to undersample it. Undersampling reverts to a frequency in the vicinity of the Nyquist frequency. The digital signal 23 also passes through a feedback loop 25 including a digital-to-analog converter 24 whose output signal is fed to the negative input 18b of the adder 19.

The third part A3 is a control device including an accumulator 29, a counter 30 and a second counter 31, all three of which are connected to a random access memory module 32 connected to a digital processor module 33. The digital processor module 33 performs calculations and generates data signals 35 that are sent to the corrector module 27 of the sigma-delta analog-to-digital converter and control signals 34 that are sent to the quantizer 22 and the switches 17 and 26.

In normal operation, the digital-to-analog converter 24 receives three different digital values (for example in the form of pairs of bits 01, 00 and 10 coding the values −1, 0 and 1), and converts them into three analog values, which should ideally be −1, 0 and 1.

The three analog points do not usually correspond ideally to the values −1, 0 and 1. For example, the analog point leaving the digital-to-analog converter whose ideal value is 0 can be corrected. The correction of the 0 point is independent of the zero value at the input 15. It is possible to correct the +1 and −1 points with the zero value still present at the input 15.

During the first calibration phase the switch 17 is switched to the zero value input 15 and the switch 26 is switched to an input 36 common to the accumulator 29, the counter 30 and the second counter 31. The quantizer 22 operates in a three-level quantizing mode. The counter 31 then counts the number $N_0$ of 0 points (points to be corrected) contained in the digital signal 23 passing from the input 36 to the counter 31. The count continues until the number $N_0$ reaches a predetermined value. To facilitate subsequent calculations the predetermined value is a power of two. It is equal to $2^{18}$, for example, i.e. to 262 144.

The accumulator 29 calculates the sum S1 of the values of the output signal of the quantizer 22. The sum S1 is stored in the random access memory 32, together with the number $N_1$ of points generated by the quantizer 22 and counted by the second counter 30. The value $2^{18}$ is chosen so that it is sufficiently large for the values stored in memory to be accurate.

The second calibration phase consists of converting the sigma-delta analog-to-digital converter with three quantizing levels into a sigma-delta analog-to-digital converter with two quantizing levels. For this it suffices to convert the three-level quantizer 22 into a two-level quantizer. The two levels are the −1 and +1 points. The switch 17 is still switched to the input 15 and the switch 26 is still switched to the input 36. During this phase the sigma-delta analog-to-digital converter is operated with zero at the input during $N_1$ samples. The accumulator 29 also calculates the sum S2 of the $N_1$ output samples. A zero point correction value is finally calculated from the equation:

$$C=(S2-S1)/N_0$$

The division is simple to effect in the digital processor module 33 because a power of two has been chosen for the value of $N_0$. The value C is then saved in the memory 32, which has three compartments in which it saves the number $N_1$, the sum S1 and the value C.

Once these two calibration phases have been completed, the phase of normal operation of the sigma-delta analog-to-digital converter with three quantizing levels begins. The switch 17 is switched to the input 16, the switch 26 is switched to the corrector module 27, and the quantizer 22 operates with three quantizing levels −1, 0 and +1. The analog signal to be digitized is fed to the input 16 and leaves the quantizer 22 in the form of a digital signal 23 which is modified by the corrector module 27 and then digitally filtered by the module 28. The corrector module 27 executes an algorithm that can be summarized as in the table below:

| input | output |
|---|---|
| 1 | 1 |
| 0 | 0 + C |
| −1 | −1 |

Thus if the digital value 0 is present at the output of the quantizer 22, it is replaced by its correction value C at the output of the corrector module 27.

Figure 5:
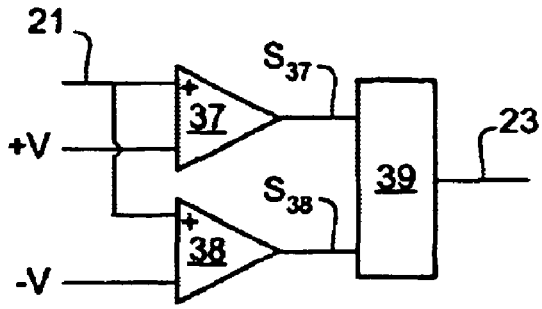
FIG. 5 depicts a diagrammatic view of a three-level quantizer implementing the invention.

FIG. 5 shows the three-level quantizer 22 made up of two comparators 37 and 38 and a digital processor module 39. The comparator 37 has two inputs, a first of which receives the signal 21 from the noise-shaping filter 20 and the second of which is maintained at a fixed voltage V equal to a positive quantizing threshold voltage. The comparator 38 also has two inputs, the first of which also receives the signal 21, and the second input of the comparator 32 is maintained at a voltage equal to −V. The output of the comparator 37 and that of the comparator 38 enter the digital processor module 39 generating the digital output signal 23. If the value of the input signal 21 is greater than V, the digital signal 23 takes the value +1. If the value of the input signal 21 is less than −V, the signal 23 takes the value −1. If the value of the input signal 21 is between −V and V, the signal 23 is equivalent to 0. The digital processor module 39 is governed by the following algorithm, in which $S_{37}$ is the output of the comparator 37, and $S_{38}$ is the output of the comparator 38:

$$+1 = S_{37}$$

$$0 = \overline{S_{37}} - S_{38}$$

$$-1 = \overline{S_{38}}$$

To convert the three-level quantizer 22 into a two-level quantizer the values V and −V at the second inputs of the comparators 37 and 38 are replaced by a null value and the algorithm of the digital processor module 39 is modified so that, when the value of the input signal 21 is positive, the signal 23 is equivalent to +1 and, when the value of the input signal 21 is negative, the signal 23 is equivalent to −1. To this end, the algorithm of the digital processor module 39 is as follows:

$$+1 = S_{37}$$

$$-1 = \overline{S_{37}}$$

In fact, only the comparator 37 is used, the comparator 38 being rendered "invisible".

The non-linearity of the sigma-delta analog-to-digital converter described above can be compensated by carrying out a calibration phase without modifying the structure of the sigma-delta analog-to-digital converter.

Figure 6A:
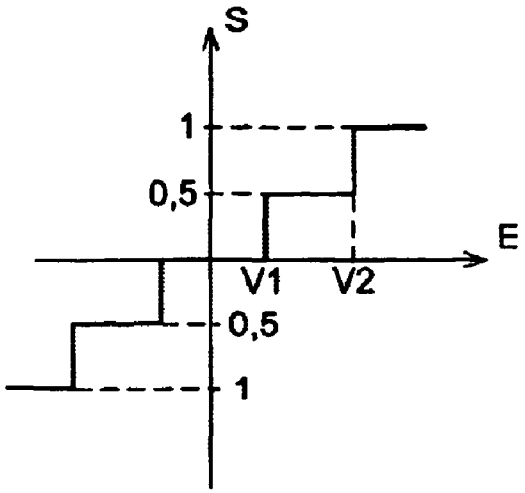
FIGS. 6a and 6b depict the results of converting a five-level quantizer into a three-level quantizer.
Figure 6B:
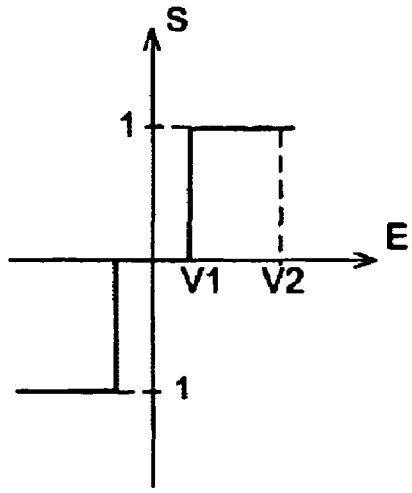

FIGS. 6a and 6b show the conversion of the five-level quantizer into a three-level quantizer. The E axis represents the input signal 7 and the S axis represents the output signal 9. FIG. 6a shows the transfer function of a five-level quantizer (−1; −0.5; 0; 0.5; 1). For example, any input signal having a value between two positive values v1 and v2 delimiting a range of values on the E axis is converted into a digital signal of value equal to 0.5 on the S axis. To correct the zero level by converting the quantizer to three levels, the intermediate levels (−0.5 and 0.5) are eliminated, as shown in FIG. 5b. The remaining three levels are therefore (−1; 0; 1).

For example, in a simulation for a signal to be converted of maximum amplitude and no correction in accordance with the invention, a sigma-delta analog-to-digital converter with three quantizing levels sampled at a frequency of 2 048 kHz had a signal/noise ratio of 46 dB. The results obtained after applying the first calibration phase with $N_0$=262 144 were as follows: $N_1$=372 522 and S1=−6 408.

Executing the second calibration phase yielded a sum S2=−3 116 and a 0 point correction value C such that:

$$C=(S2-S1)/N_0=3\ 292/262\ 144$$

A signal/noise ratio of 105 dB was then obtained in normal operation for a signal to be converted of maximum amplitude and with correction in accordance with the invention.

The method described above performs a calibration phase using a three-level quantizer and then a two-level quantizer but retains the general structure of the sigma-delta analog-to-digital converter. The calibration phase is effected simply by controlling the various switches.

What is claimed is:

1. A method of compensating the non-linearity of a sigma-delta analog-to-digital converter with a quantizer having N quantizing levels, and including a digital-to-analog converter in a feedback loop, comprising:

a normal operation phase in which a plurality of digital values corresponding to a plurality of quantizing levels are modified by correction values $C_i$, where i is a positive integer from 1 to N−2; and a calibration phase in which the correction values $C_i$ are calculated from values of the output of the quantizer of the sigma-delta analog-to-digital converter processed digitally with the digital-to-analog converter retained in the feedback loop of the sigma-delta analog-to-digital converter and after converting the *multibit* sigma-delta analog-to-digital converter into a sigma-delta analog-to-digital converter with three quantizing levels;

wherein during the calibration phase the *multibit* sigma-delta analog-to-digital converter is converted into a sigma-delta analog-to-digital converter with three quantizing levels $X_m$, $X_M$, and $X_i$, where i is from 1 to N−2;

wherein, during a period $P1_i$ of the calibration phase, a predetermined value is delivered to the input of the sigma-delta analog-to-digital converter and the values from the output of the quantizer of the sigma-delta analog-to-digital converter are processed digitally;

wherein the calibration phase is executed N−2 times, retaining the levels $X_m$ and $X_M$, and taking successively for the level $X_i$, the N−2 levels other than the levels $X_m$ and $X_M$; and wherein the correction values $C_i$ of the N−2 levels other than $X_m$ and $X_M$ are calculated using a sum of the processed values, the N−2 correction values $C_i$ being adapted to modify the N−2 levels other than $X_m$ and $X_M$ during the normal operation phase.

2. The method of claim 1, further comprising during the calibration phase and before calculating the correction values $C_i$, at least one step F during which the multibit sigma-delta analog-to-digital converter is converted into a sigma-delta analog-to-digital converter with two quantizing levels $X_m$ and $X_M$, during a period P2, wherein the predetermined value is delivered to the input of the sigma-delta analog-to-digital converter and the successive values of the output of the sigma-delta analog-to-digital converter are processed digitally.

3. The method of claim 2, wherein the sigma-delta analog-to-digital converter with N quantizing levels is converted into a sigma-delta analog-to-digital converter with a number of quantizing levels less than N by modifying quantizing threshold values and by digital processing using internal comparators.

4. The method of claim 3, wherein during the normal operation phase, the correction value $C_i$ is added to each level $X_i$ present at the output of the quantizer.

5. The method of claim 4, wherein step F of the calibration phase is executed N−2 times, each time taking a period $P2_i$ equal to each period $P1_i$, and a sum $S2_i$ is calculated of all the values leaving the sigma-delta analog-to-digital converter during each execution, after which a correction value $C_i$ corresponding to the value $X_i$ is calculated from the equation: $C_i=(S2_i-S1_i)/N_i$.

6. The method of claim 5, wherein the period $P1_i$, for each level $X_i$, is equal to the period needed to count the number $N_i$ of values equal to $X_i$ at the output of the sigma-delta analog-to-digital converter until the number $N_i$ is equal to a given number $N_0$.

7. The method of claim 3, wherein the predetermined value is equal to zero, and wherein during the calibration phase and during the period $P_i$ for each level $X_i$, the number $N_i$ of values equal to $X_i$ and the total number $NT_i$ of all the output values are counted at the output of the sigma-delta analog-to-digital converter and a sum $S1_i$ of the $NT_i$ values is calculated.

8. The method of claim 7, wherein the period $P1_i$, for each level $X_i$, is equal to the period needed to count the number $N_i$ of values equal to $X_i$ at the output of the sigma-delta analog-to-digital converter until the number $N_i$ is equal to a given number $N_0$.

9. The method of claim 3, wherein the levels $X_m$ and $X_M$ are respectively the minimum value and the maximum value of the N quantizing levels.

10. The method of claim 2, wherein the levels $X_m$ and $X_M$ are respectively the minimum value and the maximum value of the N quantizing levels.

11. The method of claim 2, wherein during the normal operation phase, the correction value $C_i$ is added to each level $X_i$ present at the output of the quantizer.

12. The method of claim 2, wherein the predetermined value is equal to zero, and wherein during the calibration phase and during the period $P1_i$ for each level $X_i$, the number $N_i$ of values equal to $X_i$ and the total number $NT_i$ of all the output values are counted at the output of the sigma-delta analog-to-digital converter and a sum $S1_i$ of the $NT_i$ values is calculated.

13. The method of claim 1, wherein the levels $X_m$ and $X_M$ are respectively the minimum value and the maximum value of the N quantizing levels.

14. The method of claim 1, wherein during the normal operation phase, the correction value $C_i$ is added to each level $X_i$ present at the output of the quantizer.

15. The method of claim 1, wherein the predetermined value is equal to zero, and wherein during the calibration phase and during the period $P1_i$ for each level $X_i$, the number $N_i$ of values equal to $X_i$ and the total number $NT_i$ of all the output values are counted at the output of the sigma-delta analog-to-digital converter and a sum $S1_i$ of the $NT_i$ values is calculated.

16. A system for compensating the non-linearity of a sigma-delta analog-to-digital converter having a quantizer with N quantizing levels, comprising:

a digital-to-analog converter in a feedback loop and a digital filter, wherein the digital-to-analog converter comprises means for calculating correction values $C_i$, where i is a positive integer from 1 to N−2, during a calibration phase, and from values of the output of the quantizer of the sigma-delta analog-to-digital converter processed digitally with the digital-to-analog converter retained in the feedback loop of the sigma-delta analog-to-digital converter and by converting the *multibit* sigma-delta analog-to-digital converter into a sigma-delta analog-to-digital converter with three quantizing levels, and means for modifying a plurality of digital values corresponding to a plurality of quantizing levels by applying the correction values $C_i$ during a normal operation phase;

wherein the calculating and modifying means comprise:

counter means for counting the values leaving the quantizer of the sigma-delta analog-to-digital converter;

at least one accumulator for summing the values leaving the quantizer of the sigma-delta analog-to-digital converter;

storage means for memorizing numbers delivered by the counter means and the accumulator;

processor means for performing calculations on the memorized numbers and generating control signals in the system for controlling the various phases;

a correction module between the quantizer and the digital filter, communicating with the processor means; and comparators and a digital processor module internal to the N-level quantizer and capable of converting the quantizer into a quantizer with fewer than N quantizing levels.

17. A method of compensating the non-linearity of a sigma-delta analog-to-digital converter with a quantizer having N quantizing levels and including a digital-to-analog converter in a feedback loop, comprising:

a normal operation phase in which a plurality of digital values corresponding to a plurality of quantizing levels are modified by correction values $C_i$, where i is a positive integer from 1 to N−2; and a calibration phase in which the correction values $C_i$ are calculated from values of the output of the quantizer of the sigma-delta analog-to-digital converter processed digitally with the digital-to-analog converter retained in the feedback loop of the sigma-delta analog-to-digital converter and after converting the *multibit* sigma-delta analog-to-digital converter into a sigma-delta analog-to-digital converter with three quantizing levels;

wherein during the calibration phase the *multibit* sigma-delta analog-to-digital converter is converted into a sigma-delta analog-to-digital converter with three quantizing levels $X_m$, $X_M$, and $X_i$, where i is from 1 to N−2;

wherein, during a period $P1_i$ of the calibration phase, a predetermined value is delivered to the input of the sigma-delta analog-to-digital converter and the values from the output of the quantizer of the sigma-delta analog-to-digital converter are processed digitally;

wherein the calibration phase is executed N−2 times, retaining the levels $X_m$ and $X_M$, and taking successively for the level $X_i$, the N−2 levels other than the levels $X_m$ and $X_M$; and wherein the correction values $C_i$ of the N−2 levels other than $X_m$ and $X_M$ are calculated using the processed values, the N−2 correction values $C_i$ being adapted to modify the N−2 levels other than $X_m$ and $X_M$ during the normal operation phase.

18. The method of claim 17, further comprising during the calibration phase and before calculating the correction values $C_i$, at least one step F during which the multibit sigma-delta analog-to-digital converter is converted into a sigma-delta analog-to-digital converter with two quantizing levels $X_m$ and $X_M$, during a period P2, wherein the predetermined value is delivered to the input of the sigma-delta analog-to-digital converter and the successive values of the output of the sigma-delta analog-to-digital converter are processed digitally.

*19. A method of compensating the non-linearity of a sigma-delta analog-to-digital converter, the method comprising:*

*during a normal operation phase:*

*operating a quantizer with N quantizing levels;*

*generating a digital output value for each of the N quantizing levels, wherein the N quantizing levels include a minimum quantizing level $X_m$, a maximum quantizing level $X_M$, and N−2 remaining quantizing levels $X_i$, where i is from 1 to N−2; and*

*modifying each of the digital output values that correspond to the N−2 remaining quantizing levels using a respective one of N−2 correction values generated during a first portion of a calibration phase that is executed N−2 times;*

*during the first portion of the calibration phase:*

*digitally processing the digital output values with a digital-to-analog converter retained in a feedback loop of the sigma-delta analog-to-digital converter;*

*calculating each respective N−2 correction value using a first sum of the digitally processed digital output values;*

*operating the quantizer with three quantizing levels comprising $X_m$, $X_M$, and one of the remaining quantizing levels $X_i$;*

*providing a predetermined input value to the sigma-delta analog-to-digital converter;*

*retaining the levels $X_m$ and $X_M$, and taking successively for the level $X_i$, the N−2 levels other than the levels $X_m$ and $X_M$; and*

*calculating the correction values of the N−2 levels other than $X_m$ and $X_M$ using a sum of the processed values.*

*20. The method of claim 19, further comprising during a second portion of the calibration phase, operating the quantizer with two quantizing levels: $X_m$ and $X_M$.*

*21. The method of claim 20, wherein the quantizer is operated with a number of quantizing levels less than N by modifying internal quantizing threshold values and by performing said digital processing using comparator circuits internal to the quantizer.*

*22. The method of claim 20, further comprising executing the calibration phase N−2 times, wherein a time to execute the second portion of the calibration phase is substantially equal to a time to execute the first portion of the calibration phase, and wherein during the second portion, a second sum ($S2_i$) is calculated from all of the digital output values during each execution, wherein each correction value ($C_i$) corresponding to each remaining quantizing level $X_i$ is calculated by $C_i=(S2_i-S1_i)/N_i$, where $N_i$ comprises a number of occurrences in which the digital output values are equal to $X_i$.*

*23. The method of claim 22, wherein the time to execute the second portion of the calibration phase is substantially equal to the period used to count the number $N_i$ until the number $N_i$ is equal to the number $N_0$.*

*24. The method of claim 19, wherein during the normal operation phase, said modifying includes adding the respective correction value to each digital output value corresponding to each remaining quantizing level $X_i$.*

*25. The method of claim 19, wherein the predetermined input value is equal to zero, and wherein during the first portion of the calibration phase, for each remaining quantizing level $X_i$, the number $N_i$ of values equal to $X_i$ and the total number $NT_i$ of all the digital output values are counted and a first sum $S1_i$ of the $NT_i$ values is calculated.*

*26. The method of claim 19, wherein during each of the N−2 executions of the first portion of the calibration phase, each of the respective correction values for the N−2 remaining quantizing levels is calculated using a first sum ($S1_i$) of a number $N_0$ of the digital output values, where $N_0$ comprises a number of occurrences in a given period of time in which the digital output values are equal to $X_i$.*

*27. A system for compensating the non-linearity of a sigma-delta analog-to-digital converter, the system comprising:*

*a quantizer configured to operate in a normal operation phase and a first portion of a calibration phase, wherein the quantizer is configured to operate during the normal operation phase with a plurality of quantizing levels (N) including a minimum quantizing level $X_m$, a maximum quantizing level $X_M$, and N−2 remaining quantizing levels $X_i$, where i is from 1 to N−2, wherein the quantizer is configured to output a plurality of digital output values, each digital output value corresponding to one of the plurality of quantizing levels, and wherein the quantizer is further configured to operate with three quantizing levels comprising $X_m$, $X_M$, and one of the remaining quantizing levels $X_i$ during the first portion of the calibration phase that is executed N−2 times;*

*a digital-to-analog converter coupled in a feedback loop to the quantizer during the first portion of the calibration phase, wherein the digital-to-analog converter is configured to digitally process the plurality of digital output values, wherein during the first portion of the calibration phase, the plurality of digital output values of the quantizer are based on a predetermined input value;*

*a control device coupled to the quantizer and configured, during the first portion of the calibration phase, to retain the levels $X_m$ and $X_M$ and take successively for the level $X_i$ the N−2 levels other than the levels $X_m$ and $X_M$, and to*

*calculate a respective correction value from the plurality of digital output values for each of the digital output values that corresponds to the N−2 remaining quantizing levels; and*

*a corrector module coupled to the quantizer, wherein the corrector module is configured, during the normal operation phase, to modify each of the digital output values that corresponds to the N−2 remaining quantizing levels using a respective one of the N−2 correction values.*

*28. The system of claim 27, wherein the control device comprises:*

*a counter circuit configured to count ones of the plurality of output digital values of the quantizer;*

*an accumulator configured to sum the plurality of output digital values of the quantizer;*

*storage device coupled to the counter circuit and to the accumulator, wherein the storage device is configured to store values provided by the counter circuit and the accumulator; and*

*a processor module coupled to the storage device and configured to perform calculations on the values stored within the storage device and to generate control signals for controlling the quantizer.*

*29. The system of claim 28, wherein the quantizer includes a comparator circuit coupled to a processor module, wherein the quantizer is configured to operate with fewer than N quantizing levels depending upon the control signals.*

*30. The system of claim 27, wherein during each of the N−2 executions of the first portion of the calibration phase, the control device is further configured to calculate each of the respective correction values for the N−2 remaining quantizing levels using a first sum ($S1_i$) of a number $N_0$ of the digital output values, where $N_0$ comprises a number of occurrences in a given period of time in which the digital output values are equal to $X_i$.*

*31. The method of claim 30, wherein the quantizer is further configured to operate with two quantizing levels: $X_m$ and $X_M$ during a second portion of the calibration phase.*

*32. A system for compensating the non-linearity of a sigma-delta analog-to-digital converter, the system comprising:*

*a quantizer configured to operate in a normal operation phase and a first portion of a calibration phase, wherein the quantizer is configured to operate during the normal operation phase with a plurality of quantizing levels (N) and to generate a digital output value for each of the N quantizing levels, wherein the N quantizing levels include a minimum quantizing level $X_m$, a maximum quantizing level $X_M$, and N−2 remaining quantizing levels $X_i$, where i is from 1 to N−2, and wherein the quantizer is further configured to operate with three quantizing levels comprising $X_m$, $X_M$, and one of the remaining quantizing levels $X_i$ during the first portion of the calibration phase that is executed N−2 times;*

*a digital-to-analog converter coupled in a feedback loop to the quantizer during the first portion of the calibration phase;*

*means for retaining the levels $X_m$ and $X_M$ and for taking successively for the level $X_i$ the N−2 levels;*

*means for calculating, during the first portion of the calibration phase, a respective correction value from the plurality of digital output values for each of the digital output values that corresponds to the N−2 remaining quantizing levels, wherein the digital output values are processed digitally by the digital-to-analog converter retained in the feedback loop of the sigma-delta analog-to-digital converter;*

*wherein the means for calculating comprises:*

*counter means for counting specific ones of the digital output values of the quantizer;*

*at least one accumulator for summing the digital output values of the quantizer;*

*storage means for storing numbers delivered by the counting means and the at least one accumulator; and*

*processor means for performing calculations on the stored numbers and generating control signals for controlling the quantizer; and*

*means for modifying, during the normal operation phase, each of the digital output values that correspond to the N−2 remaining quantizing levels using a respective one of the N−2 correction values;*

*wherein the means for modifying comprises:*

*a correction module coupled between the quantizer and a digital filter, wherein the correction module communicates with the processor means; and*

*within the quantizer, a comparator circuit and a digital processor module are configured to operate the quantizer with fewer than N quantizing levels.*

*33. The system of claim 32, wherein during each of the N−2 executions of the first portion of the calibration phase, the means for calculating is further configured to calculate each of the respective correction values for the N−2 remaining quantizing levels using a first sum ($S1_i$) of a number $N_0$ of the digital output values, where $N_0$ comprises a number of occurrences in a given period of time in which the digital output values are equal to $X_i$.*

*34. The method of claim 33, wherein during a second portion of the calibration phase, the quantizer is further configured to operate with two quantizing levels: $X_m$ and $X_M$.*

*35. The method of claim 32, wherein the digital output values are based on a predetermined value provided to an input of the sigma-delta analog-to-digital converter.*

* * * * *

UNITED STATES PATENT AND TRADEMARK OFFICE

CERTIFICATE OF CORRECTION

PATENT NO. : RE42,387 E
APPLICATION NO. : 11/487666
DATED : May 24, 2011
INVENTOR(S) : Morche It is certified that error appears in the above-identified patent and that said Letters Patent is hereby corrected as shown below:

Title page, item (57), under "Abstract", in Column 2, Line 13, delete "(24)" and insert -- (A2) --.

Column 8, line 53, in Claim 1, delete "a quantizer having" and insert -- *a quantizer having* --.

Column 8, line 59, in Claim 1, delete "N–2;" and insert -- N–*2*; --.

Column 8, line 61, in Claim 1, delete "of the quantizer" and insert -- *of the quantizer* --.

Column 8, line 65, in Claim 1, delete "*multibit*" and insert -- multibit --.

Column 9, line 1, in Claim 1, delete "*multibit*" and insert -- multibit --.

Column 9, line 5, in Claim 1, delete "wherein," and insert -- wherein --.

Column 9, line 5, in Claim 1, delete "$P1_i$ of the calibration phase," and insert -- $P1_i$[,] *of the calibration phase,* --.

Column 9, line 8, in Claim 1, delete "of the quantizer" and insert -- *of the quantizer* --.

Column 10, line 26, in Claim 16, delete "having a quantizer" and insert -- *having a quantizer* --.

Column 10, line 31, in Claim 16, delete "N–2," and insert -- N–*2*, --.

Column 10, line 32, in Claim 16, delete "of the quantizer" and insert -- *of the quantizer* --.

Column 10, line 36, in Claim 16, delete "*multibit*" and insert -- multibit --.

Column 10, lines 43-44, in Claim 16, delete "the quantizer of" and insert -- *the quantizer of* --.

Signed and Sealed this
Eleventh Day of October, 2011

David J. Kappos

David J. Kappos
*Director of the United States Patent and Trademark Office*

Column 10, line 46, in Claim 16, delete "the quantizer of" and insert -- *the quantizer of* --.

Column 10, line 49, in Claim 16, delete "counter" and insert -- [counting] *counter* --.

Column 10, lines 61-62, in Claim 17, delete "a quantizer having" and insert -- a *quantizer having* --.

Column 10, line 67, in Claim 17, delete "N–2;" and insert -- N–*2*; --.

Column 11, line 2, in Claim 17, delete "of the quantizer" and insert -- *of the quantizer* --.

Column 11, line 6, in Claim 17, delete "*multibit*" and insert -- multibit --.

Column 11, line 9, in Claim 17, delete "*multibit*" and insert -- multibit --.

Column 11, line 14, in Claim 17, delete "wherein," and insert -- wherein --.

Column 11, line 14, in Claim 17, delete "$P1_i$ of the calibration phase," and insert -- $P1_i$[,] *of the calibration phase,* --.

Column 11, line 17, In Claim 17, delete "of the quantizer" and insert -- *of the quantizer* --.